United States Patent
Goswami et al.

(10) Patent No.: US 9,069,699 B2
(45) Date of Patent: Jun. 30, 2015

(54) IDENTIFYING INCONSISTENT CONSTRAINTS

(75) Inventors: Dhiraj Goswami, Wilsonville, OR (US); Soe Myint, Santa Clara, CA (US); Ngai Ngai William Hung, San Jose, CA (US); Rajarshi Mukherjee, San Jose, CA (US)

(73) Assignee: SYNOPSYS, INC., Mountain View, CA (US)

( * ) Notice: Subject to any disclaimer, the term of this patent is extended or adjusted under 35 U.S.C. 154(b) by 553 days.

(21) Appl. No.: 13/074,940

(22) Filed: Mar. 29, 2011

(65) Prior Publication Data

US 2012/0253754 A1 Oct. 4, 2012

(51) Int. Cl.
  G06F 7/60 (2006.01)
  G06F 17/10 (2006.01)
  G06F 17/11 (2006.01)
  G06F 17/50 (2006.01)

(52) U.S. Cl.
  CPC ............ *G06F 17/11* (2013.01); *G06F 17/5018* (2013.01)

(58) Field of Classification Search
  None
  See application file for complete search history.

(56) References Cited

U.S. PATENT DOCUMENTS

| | | | |
|---|---|---|---|
| 2005/0021486 A1* | 1/2005 | Naveh | 706/46 |
| 2005/0044512 A1* | 2/2005 | Lockyear et al. | 716/1 |
| 2006/0247930 A1* | 11/2006 | Iyer | 704/236 |
| 2009/0204968 A1* | 8/2009 | Kahlon et al. | 718/100 |
| 2010/0017352 A1* | 1/2010 | Maturana | 706/46 |

OTHER PUBLICATIONS

Joan-Arinyo et al., Combining Constructive and Equational Geometric Constraint-Solving Techniques, Jan. 1999, ACM, vol. 18 No. 1, pp. 35-55.*

* cited by examiner

*Primary Examiner* — Omar Fernandez Rivas
*Assistant Examiner* — Bernard E Cothran
(74) *Attorney, Agent, or Firm* — Park, Vaughan, Fleming & Dowler LLP; Laxman Sahasrabuddhe

(57) ABSTRACT

Methods and apparatuses are described for identifying inconsistent constraints. During operation, a system can receive a set of constraints, wherein each constraint is defined over one or more random variables from a set of random variables. If an inconsistency or conflict is detected while solving the set of constraints, the system can identify a phase in a series of phases of the constraint solver where the inconsistency was detected. The system can then try to solve different subsets of the set of constraints to identify smaller subsets of the set of constraints that contain the inconsistency. When the system tries to solve a subset of the set of constraints, the system can determine whether or not an inconsistency is detected in the identified phase while solving the subset of the set of constraints. Next, the system can report the smallest subset of inconsistent constraints that was found to a user.

21 Claims, 5 Drawing Sheets

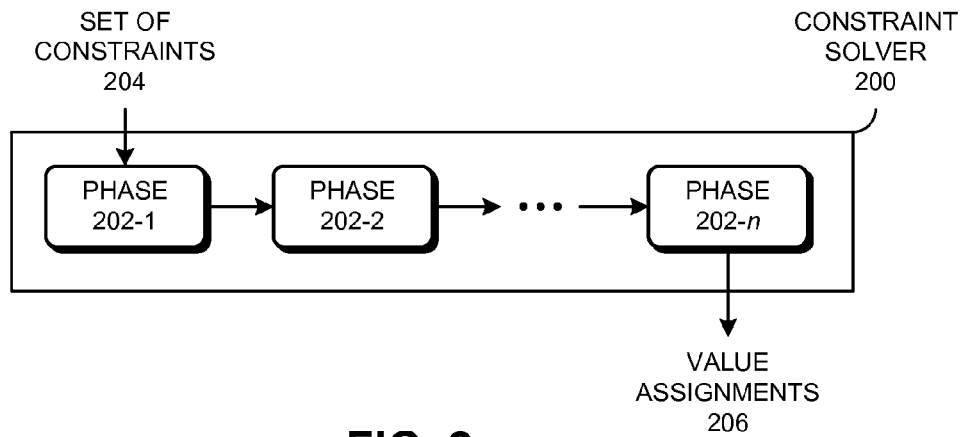
FIG. 2
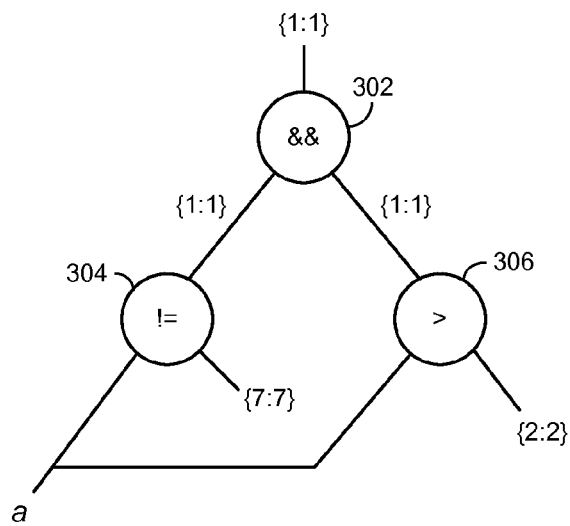
FIG. 3
$$C(a,b,c) = \overline{a} \cdot b \cdot c + a \cdot \overline{b} \cdot c + a \cdot b \cdot \overline{c}$$
FIG. 4A

$$Z_1 : \overline{x_1} + x_2$$
$$502 \begin{cases} Z_2 : x_1 \cdot \overline{x_2} \\ Z_3 : x_1 + \overline{x_2} + x_3 \end{cases}$$

$$K_1 = Z_1 \quad 504$$

$$K_2 = Z_1 \cdot Z_2 \quad 506$$

$$K_3 = Z_1 \cdot Z_2 \cdot Z_3 \quad 508$$

IDENTIFYING INCONSISTENT CONSTRAINTS

BACKGROUND

1. Technical Field

This disclosure generally relates to constraint solvers. More specifically, this disclosure relates to methods and apparatuses for identifying a set of inconsistent constraints.

2. Related Art

The importance of circuit verification cannot be over-emphasized. Indeed, without circuit verification it would have been impossible to design complicated integrated circuits which are commonly found in today's computing devices.

Constrained random simulation methodologies have become increasingly popular for functional verification of complex designs, as an alternative to directed-test based simulation. In a constrained random simulation methodology, random vectors are generated to satisfy certain operating constraints of the design. These constraints are usually specified as part of a test-bench program. A test-bench automation tool (TBA) uses the test-bench program to generate random solutions for a set of random variables, such that a set of constraints over the set of random variables is satisfied. These random solutions can then be used to generate valid random stimulus for the Design Under Verification (DUV). This stimulus is simulated using simulation tools, and the results of the simulation are typically examined within the test-bench program to monitor functional coverage, thereby providing a measure of confidence on the verification quality and completeness.

Constraint solvers are typically used to generate random vectors that satisfy the set of constraints. Constraint solvers solve the following constraint satisfaction problem: given a set of random variables and a set of constraints, assign a set of random values to the set of random variables that satisfy the set of constraints. Note that, if the set of constraints are inconsistent, the constraint solver will not be able to assign random values to the random variables that satisfy the set of constraints. Therefore, it is generally desirable to be able to identify inconsistencies in a set of constraints.

SUMMARY

Embodiments described in this disclosure provide methods and apparatuses for identifying a subset of inconsistent constraints in a set of constraints. During operation, a system can receive a set of constraints, wherein each constraint is defined over one or more random variables from a set of random variables. A constraint solver can be viewed as solving a set of constraints in a series of phases. In some constraint solvers, each phase in the series of phases attempts to further restrict the solution space of the set of constraints.

If an inconsistency or conflict is detected while solving the set of constraints, the system can identify a phase in the series of phases of the constraint solver where the inconsistency was detected. The system can then try to solve different subsets of the set of constraints to identify smaller subsets of the set of constraints that contain the inconsistency. Next, the system can report the smallest subset of inconsistent constraints that was found to a user.

When the system tries to solve a subset of the set of constraints, the system can determine whether or not an inconsistency is detected in the identified phase while solving the subset of the set of constraints. Specifically, the system can process the phases up to the identified phase, and skip processing the remaining phases in the series of phases. The system can then return a result that indicates whether or not an inconsistency was detected in the identified phase while solving the subset of the set of constraints.

A constraint solver can generally be any system capable of assigning values to a set of random variables so that the assigned values satisfy a set of constraints. For example, constraint solvers can include, but are not limited to, canonical-representation-based constraint solvers, Satisfiability (SAT)-based constraint solvers, Satisfiability Modulo Theories (SMT)-based constraint solvers, Automatic Test Pattern Generation (ATPG)-based constraint solvers, and hybrid constraint solvers that combine multiple constraint solving techniques.

In this disclosure, unless otherwise stated, the term "based on" means "based solely or partly on."

BRIEF DESCRIPTION OF THE FIGURES

FIG. 2 illustrates a constraint solver that includes a series of phases in accordance with some embodiments described in this disclosure.

FIG. 3 illustrates a word-level circuit that an ATPG-based constraint solver may create for a constraint problem in accordance with some embodiments described in this disclosure.

FIG. 4A illustrates a constraint in accordance with some embodiments described in this disclosure.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
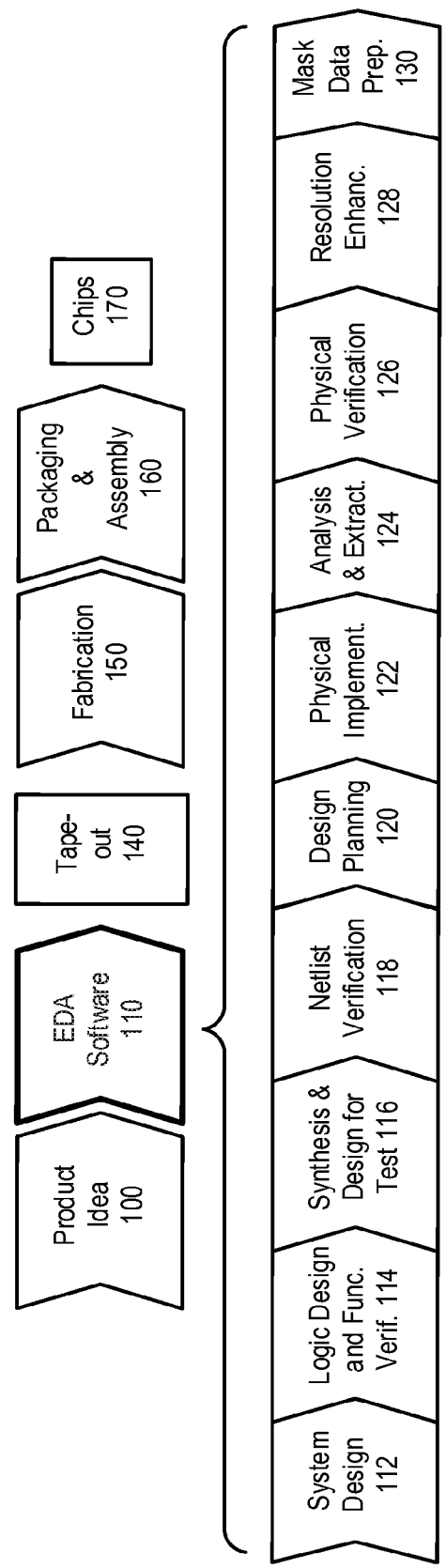
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to correct any functional, manufacturing, electrical, or lithographic issues.

In the resolution enhancement step 128, geometric manipulations can be performed on the layout to improve manufacturability of the design. Finally, in the mask data preparation step 130, the design can be taped-out 140 for production of masks to produce finished chips.

Constraint Solvers

Constrained random simulation methodologies have become increasingly popular for functional verification of complex designs. Some constrained random simulation methodologies use constraint solvers to generate random vectors that satisfy a set of constraints. Constraint solvers solve the following constraint satisfaction problem: given a set of random variables and a set of constraints, assign a set of random values to the set of random variables that satisfy the set of constraints. Some constraint solvers can be viewed as having a series of phases. In some constraint solvers, each phase progressively restricts the solution space for the set of constraints.

FIG. 2 illustrates a constraint solver that includes a series of phases in accordance with some embodiments described in this disclosure.

Constraint solver 200 can include phases 202-1, 202-2, . . . , 202-n. During operation, constraint solver 200 can solve set of constraints 204 by executing each phase in sequence. For example, constraint solver 200 can provide set of constraints 204 to phase 202-1. Once phase 202-1 completes, phase 202-2 can begin, and so forth. In some constraint solvers, each phase can attempt to further restrict the solution space for the set of constraints. Finally, during phase 202-n, constraint solver 200 can randomly select values for the random variables from the solution space and optionally check if the values satisfy set of constraints 204. If the randomly selected values satisfy set of constraints 204, constraint solver 200 can output value assignments 206 for the random variables.

In general, a constraint solver may assign a value to a random variable in any phase. For example, during a phase, if a constraint solver is able to restrict the solution space so that the range of values for a random variable is a single value, then the constraint solver can assign the value to the random variable.

Some embodiments described in this disclosure use constraint solvers that are based on ATPG or canonical representations (e.g., Binary Decision Diagrams). Although embodiments have been described in the context of these two constraint solvers, the general principles defined herein can be applied to other constraint solvers without departing from the spirit and scope of the present disclosure. For example, the methods and apparatuses described in this disclosure can be applied to SAT-based constraint solvers, SMT-based constraint solvers, hybrid constraint solvers that combine multiple constraint solving techniques, and any other constraint solver that processes the set of constraints in a set of phases.

Some embodiments described in this disclosure use an ATPG-based constraint solver that creates a word-level circuit model to represent the constraints and uses a word-level value system to represent possible values for all nodes in this model. This word-level value system may use intervals and ranges to represent multiple values in a compact form. For example, let "a" be a 4 bit unsigned variable. Independent of the constraints on "a," we can say that the possible values that "a" can have are $\{0:15\}$, i.e., from 0 to 15. Note that this compactly represents multiple values, without explicitly enumerating all the values. This representation can be referred to as an interval.

Suppose the constraint "a !=7" is imposed on variable "a." This constraint restricts the values "a" can have to $\{0:6\}$, $\{8:15\}$. Such a "list of intervals" can be referred to as a range. If another constraint, "a>2," is added, the range value that variable "a" can take is further restricted to $\{3:6\}, \{8:15\}$. A constraint problem that is based on these constraints can be stated as follows: determine random values for variable "a," such that all the constraints on variable "a" are satisfied. The above-described constraint problem can be represented by the following lines of code:

```
rand bit[3:0] a;
constraint cons1 {
    a != 7;
    a > 2;
}
```

FIG. 3 illustrates a word-level circuit that an ATPG-based constraint solver may create for a constraint problem in accordance with some embodiments described in this disclosure.

The ATPG-based constraint solver used by some embodiments described in this disclosure may create a word-level circuit that includes nodes 302, 304, and 306. Node 302 can correspond to conjunction of the set of constraints, node 304 can correspond to constraint "a !=7," and node 306 can correspond to constraint "a>2." The "&&" operator shown inside node 302 indicates that both constraints need to be satisfied.

An ATPG-based constraint solver can be viewed as having three phases: static implication, static learning, and ATPG-based value assignment. After creating the word-level circuit model, the ATPG-based constraint solver can perform static implications to refine the range values on each node in the circuit. The result of performing static implications is also shown in FIG. 3. Specifically, the range value shown next to each node in the circuit is the result of performing static implications. After performing static implications, the ATPG-based constraint solver can perform static learning to further refine the range values. In static learning, the ATPG-based constraint solver can assign a value to a random variable and then perform implications to determine the effect the assignment has on other random variables. In this manner, the ATPG-based constraint solver can learn new relationships between random variables which can be used in subsequent phases. In the third phase, the ATPG-based constraint solver can perform random ATPG to assign values to random variables and check if the assigned values satisfy the constraints.

For example, in the word-level circuit illustrated in FIG. 3, suppose the ATPG-based constraint solver picks a random value "5" for variable "a" during the third phase. Once this value is picked, the constraint solver can invoke its implication engine to incrementally update the range values in the circuit and to determine if this value assignment to variable "a" results in any conflicts. For the value "5," the implication engine will evaluate the "!=" comparator node and the ">" comparator node to determine that there is no conflict. Therefore, the assignment "a=5" is determined as a legal random assignment that satisfies all the constraints.

If a conflict is encountered during the implication process in the third phase, the constraint solver can backtrack on the last assigned variable and try other value assignment until the constraint solver determines an assignment that does not result in any conflicts (if such a solution exists). Further details of an ATPG-based constraint solver can be found in U.S. Pat. No. 7,243,087, entitled "Method and Apparatus for Solving Bit-Slice Operators," by inventor Mahesh A. Iyer, issued on Jul. 10, 2007, the contents of which are herein incorporated by reference.

In some embodiments described in this disclosure, a constraint solver represents the set of constraints in a canonical representation (e.g., a BDD), and then uses the canonical representation to determine solutions to the set of constraints. For example, if the set of constraints is represented by a BDD, each path in the BDD from the root node to the terminal node that corresponds to the value "1" can be associated with a value assignment that satisfies the set of constraints.

FIG. 4A illustrates a constraint in accordance with some embodiments described in this disclosure. The constraint illustrated in FIG. 4A is a Boolean function over three variables: "a," "b," and "c." The variables may model signals in the DUV, e.g., the variable "a" may be a random variable that represents the logic state of an input signal in the DUV. Variable "b" may be a state variable that represents the output of a logic gate in the DUV.

Figures 4B, 5:
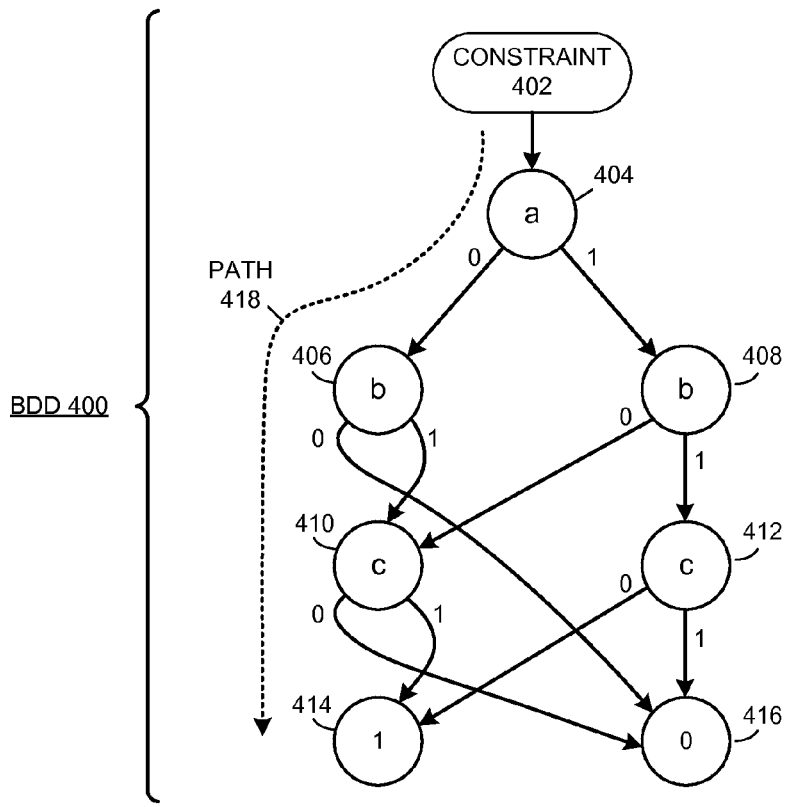
FIG. 4B illustrates a Binary Decision Diagram (BDD) in accordance with some embodiments described in this disclosure.
FIG. 5 illustrates how a BDD can be constructed from a set of constraints in accordance with an embodiment of the present invention.

FIG. 4B illustrates a BDD in accordance with some embodiments described in this disclosure.

BDD 400 can represent the constraint shown in FIG. 4A. BDD 400 includes nodes 402, 404, 406, 408, 410, 412, 414, and 416. Node 402 can be the root node which can be used to represent the entire constraint. Node 404 can be associated with variable "a," nodes 406 and 408 can be associated with variable "b," and nodes 410 and 412 can be associated with variable "c." Node 414 can represent the Boolean value "TRUE" or "1" for the Boolean function. In other words, node 414 can represent a situation in which the constraint has been satisfied. In contrast, node 416 can represent the Boolean value "FALSE" or "0." In other words, node 416 can represent a situation in which the constraint has not been satisfied.

The directed edges in BDD 400 can represent a value assignment to a variable. For example, the directed edge between nodes 404 and 406 can be associated with assigning value "0" to the random variable "a." Similarly, the directed edge between nodes 408 and 412 can be associated with assigning value "1" to the state variable "b."

A directed path in a BDD from the root node, e.g., node 402, to the terminal node for the Boolean value "TRUE," e.g., node 414, can correspond to a value assignment to the variables that satisfies the set of constraints which is being represented by the BDD, e.g., the constraint shown in FIG. 4A. For example, path 418 begins at node 402 and terminates at node 414. The value assignments associated with path 418 are: a=0, b=1, and c=1. It will be evident that this value assignment causes the Boolean function shown in FIG. 4A to evaluate to "TRUE."

Once the system builds the BDD, it can generate constrained random stimulus by determining all distinct paths from the root node to the terminal node associated with the "TRUE" value, and by randomly selecting a path from the set of all distinct paths.

Note that BDDs are only one of the many different types of canonical representations that can be used to generate the random stimulus. A canonical representation of a logical function (e.g., a constraint) can generally be any representation which satisfies the following property: if two logical functions are equivalent, their canonical representations will be the same as long as the same variable ordering (or an equivalent characteristic) is used while constructing the canonical representation. Examples of canonical representations include, but are not limited to, binary decision diagrams, binary moment diagrams, zero-suppressed binary decision diagrams, multi-valued decision diagrams, multiple-terminal binary decision diagrams, and algebraic decision diagrams.

FIG. 5 illustrates how a BDD can be constructed from a set of constraints in accordance with an embodiment of the present invention.

Suppose a constrained random simulation needs to generate random inputs that satisfy set of constraints 502. A constraint solver can build a BDD for each constraint, i.e., one BDD each for constraints $Z_1$, $Z_2$, and $Z_3$. Next, the constraint solver can represent the conjunction of the set of constraints by using a BDD which is constructed by combining the individual BDDs.

In some embodiments, the constraint solver can combine the BDDs in an iterative fashion, and each iteration can be viewed as a phase. For example, in phase 504, the constraint solver can start with a BDD for constraint $K_1$ which is the same as constraint $Z_1$. Next, in phase 506, the constraint solver can construct a BDD for constraint $K_2$ which is equal to the conjunction of constraints $Z_1$ and $Z_2$. Note that the BDD for constraint $K_2$ can be constructed by combining the BDDs for $K_1$ and $Z_2$. Finally, in phase 508, the constraint solver can construct a BDD for $K_3$ which is equal to the conjunction of constraints $Z_1$, $Z_2$, and $Z_3$. Note that the BDD for constraint $K_3$ can be constructed by combining the BDDs for $K_2$ and $Z_3$. Further, note that the BDD for $K_3$ is a BDD for set of constraints 502. The BDD for $K_3$ can be used to generate random inputs that satisfy set of constraints 502. Further details on how to build and combine BDDs can be found in Jun Yuan et al., *Constraint-Based Verification*, Springer, January 2006.

Techniques that use other canonical representations can also use a similar approach, i.e., build canonical representations for the individual constraints and then combine the individual canonical representations in an iterative fashion to obtain a canonical representation for the set of constraints. Each iteration in these approaches can be viewed as a phase.

In canonical-representation-based approaches, an inconsistency may be detected when two canonical representations are combined. For example, an inconsistency may be detected in phase 506 when the constraint solver attempts to combine the canonical representations for constraints $Z_1$ and $Z_2$.

Identifying Inconsistent Constraints

Consider the following lines of code that define eight constraints C1-C8:

```
rand integer x, y;
constraint debug_c {
```

```
    x > 0;      // C1
    y > 50;     // C2
    x < 100;    // C3
    y > 70;     // C4
    x == y;     // C5
    y > 75;     // C6
    y > 100;    // C7
    y > 150;    // C8
}
```

Note that constraints C3, C5, and C7, when taken together, are inconsistent. In some embodiments, a constraint solver can try to solve different subsets of constraints to determine smaller subsets of constraints that have inconsistencies, and report the smallest subset of inconsistent constraints to a user to enable the user to fix the inconsistency.

For example, a system can try different subsets of constraints C1-C8 to localize the inconsistency as follows.

```
S1: C1-4 ON, C5-8 OFF              // Consistent
S2: C1-6 ON, C7-8 OFF              // Consistent
S3: C1-7 ON, C8 OFF                // Inconsistent
Therefore, C7 Must-ON, C8 OFF
S4: C1-3 OFF, C4-6 ON              // Consistent
S5: C1-2 OFF, C3-6 ON              // Inconsistent
Therefore, C3 Must-ON, C1-C2 OFF
S6: C4-5 OFF, C6 ON                // Consistent
S7: C4 OFF, C5-6 ON                // Inconsistent
Therefore, C5 Must-ON, C4 OFF
S8: C6 OFF                         // Inconsistent
Therefore, C3, C5, C7 are inconsistent
constraints
```

In the above example, S1-S8 are eight different subsets of constraints that the constraint solver tries to solve. Subset S1 includes constraints C1-C4, but does not include constraints C5-C8. This is indicated in the above using the notation "C1-4 ON, C5-8 OFF." When the constraint solver tried to solve subset of constraints S1, no inconsistencies were detected. This fact is indicated by the word "Consistent" at the end of the line that defines subset S1.

After trying to solve subsets S1-S3, the constraint solver can conclude that constraint C7 is required to be in the subset for the subset to have an inconsistency, and that constraint C8 can be ignored. After trying to solve subsets S4 and S5, the constraint solver can conclude that constraint C3 is required to be in the subset for the subset to have an inconsistency, and constraints C1 and C2 can be ignored. After trying to solve S6 and S7, the constraint solver can conclude that constraint C5 is required to be in the subset for the subset to have an inconsistency, and that constraint C4 can be ignored. Finally, after trying to solve subset S8, the constraint solver can conclude that the smallest subset of constraints that has an inconsistency is a subset that includes constraints C3, C5, and C7.

In conventional approaches, when the constraint solver tries to solve a subset of constraints, it processes all of the phases until an inconsistency is detected. For example, in conventional approaches, when the constraint solver is provided subset S2 shown above, the constraint solver processes all of the phases before determining that the subset of constraints is consistent.

In contrast, in some embodiments described in this disclosure, the constraint solver first tries to solve the set of constraints and identifies a phase where an inconsistency is detected. Next, for each subsequent subset of constraints that is provided to the constraint solver, the constraint solver processes phases only up to the identified phase, i.e., the constraint solver does not process any of the subsequent phases. For example, in FIG. 2, if an inconsistency is detected in phase 202-k while solving the set of constraints, then, in some embodiments, the constraint solver processes phases 202-1 through 202-k for each subset of constraints, but does not process any subsequent phases.

If no inconsistencies are detected up to the identified phase, the constraint solver concludes that the subset of constraints does not have the inconsistency that was identified when the entire set of constraints was being solved. On the other hand, if an inconsistency is detected in the identified phase, the constraint solver concludes that the subset of constraints has an inconsistency. The constraint solver can return a value accordingly, which indicates whether or not an inconsistency was detected in the identified phase while solving the subset of constraints.

Figure 6:
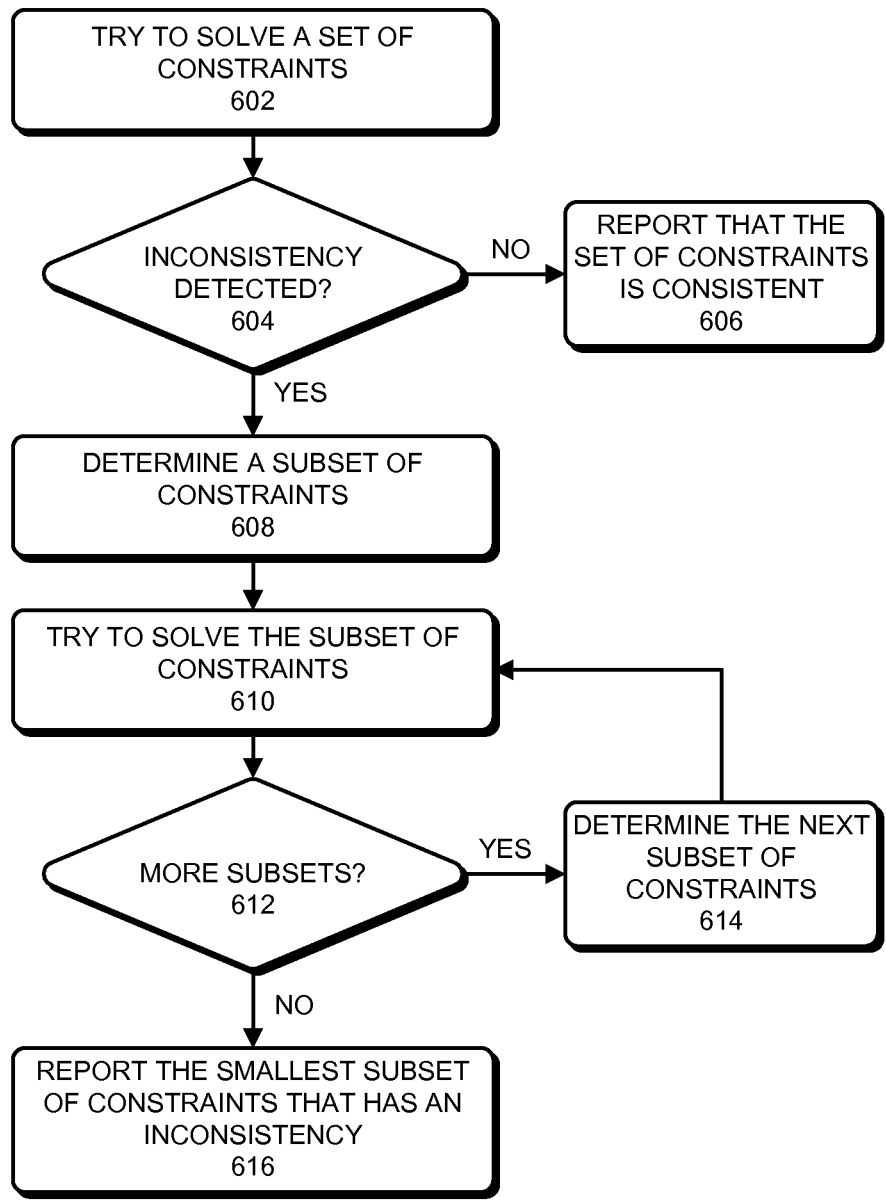
FIG. 6 presents a flowchart that illustrates a process for determining smaller subsets of a set of constraints that contain an inconsistency in accordance with some embodiments described in this disclosure.

FIG. 6 presents a flowchart that illustrates a process for determining smaller subsets of a set of constraints that contain an inconsistency in accordance with some embodiments described in this disclosure.

A constraint solver can try to solve a set of constraints (block 602). If no inconsistencies are detected ("NO" branch from block 604), the constraint solver can report that the set of constraints is consistent (block 606). On the other hand, if an inconsistency is detected ("YES" branch from block 604), the system can determine a subset of constraints (block 608). The constraint solver can then try to solve the subset of constraints (block 610). Depending on whether or not an inconsistency is detected while solving the subset of constraints, the system can determine whether more subsets need to be checked (block 612). If more subsets need to be checked ("YES" branch from block 612), the system can determine the next subset of constraints that needs to be checked (block 614) and try to solve this subset of constraints (block 610). On the other hand, if no more subsets need to be checked ("NO" branch from block 612), the system can report the smallest subset of constraints that has an inconsistency (block 616).

In some embodiments, the system can use a binary or linear search technique to determine the smallest subset of constraints that has an inconsistency. For example, suppose there are eight constraints, C1-C8. In the binary search based technique, the system can create a subset S1 that includes the first four constraints C1-C4, and check if subset S1 has any inconsistencies. If subset S1 has inconsistencies, then the system can halve the subset, i.e., create a subset S2 that includes constraints C1 and C2, and check for inconsistencies in this subset.

On the other hand, if subset S1 did not have any inconsistencies, the system can add two more constraints, namely C5 and C6, into subset S1 to create subset S3, and check for inconsistencies in subset S3. In this manner, the system can use a binary search based technique to determine the smallest subset that has inconsistencies. In a linear search based technique, the system can linearly decrease or increase the size of the subset to determine the smallest subset that has an inconsistency.

Figure 7:
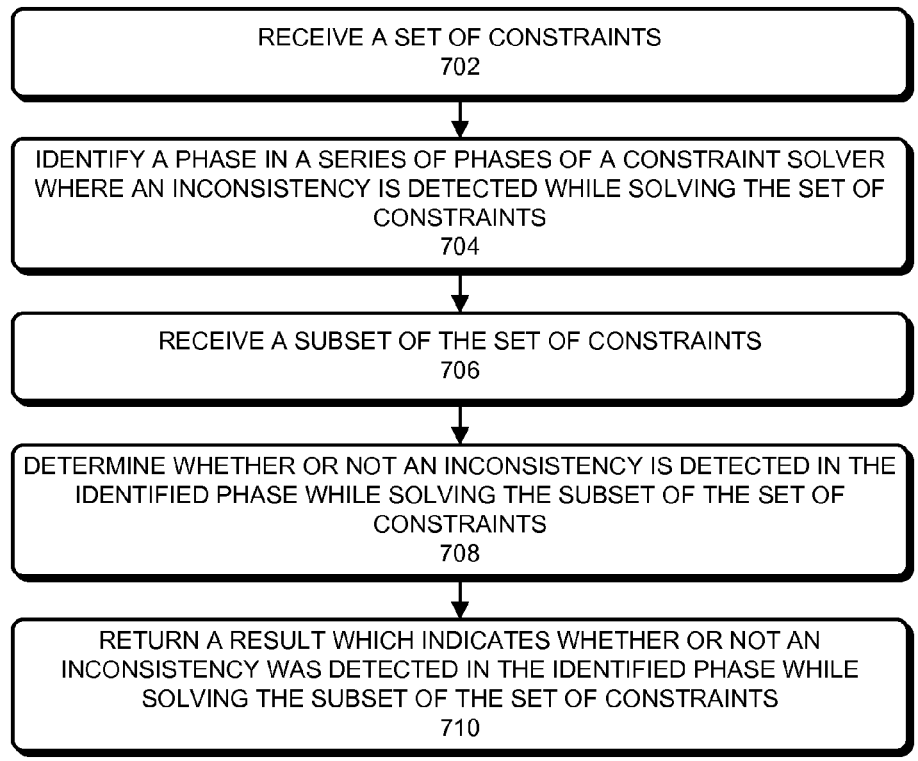
FIG. 7 presents a flowchart that illustrates a process for determining whether or not a subset of constraints contains an inconsistency in accordance with some embodiments described in this disclosure.

FIG. 7 presents a flowchart that illustrates a process for determining whether or not a subset of constraints contains an inconsistency in accordance with some embodiments described in this disclosure.

A system can receive a set of constraints (block 702). Note that the term "receive" and variants thereof are used in this disclosure to refer to an operation that makes information available to the system. For example, the system may receive the set of constraints when a user provides a file name to the system which contains a description of the set of constraints. Alternatively, the system may receive the set of constraints when the system receives a sequence of packets which describe the set of constraints. In yet another example, the system may receive the set of constraints when the set of constraints or a reference to the set of constraints is passed as a parameter to an invoked function. Next, the system can identify a phase in a series of phases of a constraint solver where an inconsistency is detected while solving the set of constraints (block 704). The system can then receive a subset of constraints (block 706). Next, the system can determine whether or not an inconsistency is detected in the identified phase while solving the subset of the set of constraints (block 708). The system can then return a result which indicates whether or not an inconsistency was detected in the identified phase while solving the subset of the set of constraints (block 710). In some embodiments, when the system returns the result, it can terminate the constraint solving process, e.g., the system may not process subsequent phases in the series of phases.

In some embodiments, each phase can be further divided into a series of sub-phases, and the system can identify a sub-phase within a phase where the inconsistency is detected while solving the set of constraints. Then, when determining whether or not a subset of the set of constraints contains the same conflict, the system can process the sub-phases up to the identified sub-phase, and skip the subsequent sub-phases and phases.

For example, as explained above, an ATPG-based constraint solver can convert the constraint problem into a word-level circuit. Random variables can correspond to inputs to the circuit. Constraint operators can be represented by operators in the circuit. Each constraint can be represented by a tree of operators in the circuit. The nodes in the word-level circuit can be labeled according to their level in the tree. For example, according to one labeling, the primary inputs in the word-level circuit can be considered as level 0, their immediate fan-outs (with no other operator input) can be considered to be level 1, and so forth.

Each level can be considered as a sub-phase in the static learning phase of an ATPG-based constraint solver. If the conflict in the original constraint problem (i.e., the original set of constraints) was found during the static learning phase in a node at a certain level of the word-level circuit, the system can execute the static learning phase while solving a subset of constraints until the constraint solver finishes learning at the same level at which the original conflict was found. In other words, in these embodiments, the constraint solver does not finish the entire static learning phase when solving subsets of constraints; instead, the constraint solver performs static learning until the identified level is reached and then returns a value that indicates whether or not a conflict was detected.

In some embodiments, each node in the word-level circuit can be considered to be a sub-phase of the static learning phase. The system can identify the exact node in the word-level circuit at which the conflict was detected while solving the original set of constraints. The system can then use the constraint solver to try to solve a subset of constraints until the exact same node is reached in the static learning phase. The constraint solver can then return a value that indicates whether or not the conflict was detected at the node.

Figure 8:
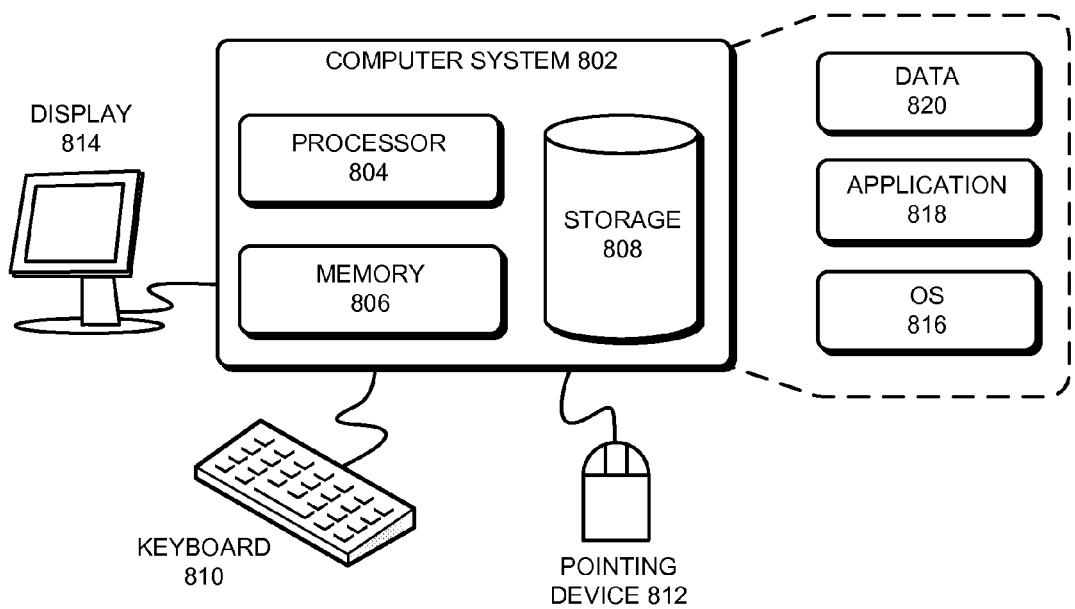
FIG. 8 illustrates a computer system in accordance with some embodiments described in this disclosure.

FIG. 8 illustrates a computer system in accordance with some embodiments described in this disclosure. Computer system 802 can include processor 804, memory 806, and storage device 808. Computer system 802 can be coupled to display device 814, keyboard 810, and pointing device 812. Storage device 808 can store operating system 816, application 818, and data 820. Data 820 can include constraints.

Computer system 802 may automatically perform any method that is implicitly or explicitly described in this disclosure. Specifically, during operation, computer system 802 can load application 818 into memory 806. Application 818 can then determine one or more subsets of a set of constraints that have an inconsistency, and report the smallest subset among the one or more subsets. In some embodiments, application 818 can determine a minimal subset of the set of constraints that has an inconsistency.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for identifying inconsistent constraints, the method comprising:
receiving a set of constraints, wherein each constraint is defined over one or more random variables from a set of random variables;
while solving the set of constraints by using a constraint solver executing on a computer, identifying a phase in a series of phases of the constraint solver where an inconsistency in the set of constraints is detected, wherein detecting an inconsistency in the set of constraints implies that no value assignment can simultaneously satisfy all of the constraints in the set of constraints;

receiving a subset of the set of constraints;

and while solving the subset of the set of constraints by using the constraint solver executing on the computer, processing only up to the identified phase in the series of phases of the constraint solver.

2. The method of claim 1, wherein the constraint solver is a canonical-representation-based constraint solver.

3. The method of claim 1, wherein the constraint solver is a Satisfiability (SAT)-based constraint solver.

4. The method of claim 1, wherein the constraint solver is a Satisfiability Modulo Theories (SMT)-based constraint solver.

5. The method of claim 1, wherein the constraint solver is an Automatic Test Pattern Generation (ATPG)-based constraint solver.

6. The method of claim 1, wherein the constraint solver is a hybrid constraint solver that combines multiple types of constraint solving techniques.

7. The method of claim 1, wherein each phase in the series of phases attempts to further restrict the solution space of the set of constraints.

8. A non-transitory computer-readable storage medium storing instructions that, when executed by a computer, cause the computer to perform a method for identifying inconsistent constraints, the method comprising:

receiving a set of constraints, wherein each constraint is defined over one or more random variables from a set of random variables;

while solving the set of constraints, identifying a phase in a series of phases of a constraint solver where an inconsistency in the set of constraints is detected, wherein detecting an inconsistency in the set of constraints implies that no value assignment can simultaneously satisfy all of the constraints in the set of constraints;

receiving a subset of the set of constraints;

and while solving the subset of the set of constraints, processing only up to the identified phase in the series of phases of the constraint solver.

9. The non-transitory computer-readable storage medium of claim 8, wherein the constraint solver is a canonical-representation-based constraint solver.

10. The non-transitory computer-readable storage medium of claim 8, wherein the constraint solver is a Satisfiability (SAT)-based constraint solver.

11. The non-transitory computer-readable storage medium of claim 8, wherein the constraint solver is a Satisfiability Modulo Theories (SMT)-based constraint solver.

12. The non-transitory computer-readable storage medium of claim 8, wherein the constraint solver is an Automatic Test Pattern Generation (ATPG)-based constraint solver.

13. The non-transitory computer-readable storage medium of claim 8, wherein the constraint solver is a hybrid constraint solver that combines multiple types of constraint solving techniques.

14. The non-transitory computer-readable storage medium of claim 8, wherein each phase in the series of phases attempts to further restrict the solution space of the set of constraints.

15. A system, comprising:

a processor; and a storage medium storing instructions that, when executed by the processor, cause the system to perform a method for identifying inconsistent constraints, the method comprising:

receiving a set of constraints, wherein each constraint is defined over one or more random variables from a set of random variables;

while solving the set of constraints, identifying a phase in a series of phases of a constraint solver where an inconsistency in the set of constraints is detected, wherein detecting an inconsistency in the set of constraints implies that no value assignment can simultaneously satisfy all of the constraints in the set of constraints;

receiving a subset of the set of constraints;

while solving the subset of the set of constraints, processing only up to the identified phase in the series of phases of the constraint solver.

16. The system of claim 15, wherein the constraint solver is a canonical-representation-based constraint solver.

17. The system of claim 15, wherein the constraint solver is a Satisfiability (SAT)-based constraint solver.

18. The system of claim 15, wherein the constraint solver is a Satisfiability Modulo Theories (SMT)-based constraint solver.

19. The system of claim 15, wherein the constraint solver is an Automatic Test Pattern Generation (ATPG)-based constraint solver.

20. The system of claim 15, wherein the constraint solver is a hybrid constraint solver that combines multiple types of constraint solving techniques.

21. The system of claim 15, wherein each phase in the series of phases attempts to further restrict the solution space of the set of constraints.

* * * * *